United States Patent
Wang et al.

(10) Patent No.: US 9,666,344 B2
(45) Date of Patent: May 30, 2017

(54) SUPERCONDUCTING MAGNET SYSTEM FOR HEAD IMAGING

(71) Applicant: Institute of Electrical Engineering, Chinese Academy of Sciences, Beijing (CN)

(72) Inventors: Qiuliang Wang, Beijing (CN); Xinning Hu, Beijing (CN); Zhipeng Ni, Beijing (CN); Lankai Li, Beijing (CN); Luguang Yan, Beijing (CN); Yi Li, Beijing (CN); Yinming Dai, Beijing (CN)

(73) Assignee: Institute of Electrical Engineering, Chinese Academy of Sciences, Beijing (CN)

( * ) Notice: Subject to any disclaimer, the term of this patent is extended or adjusted under 35 U.S.C. 154(b) by 85 days.

(21) Appl. No.: 14/759,261

(22) PCT Filed: Aug. 19, 2013

(86) PCT No.: PCT/CN2013/081715
§ 371 (c)(1),
(2) Date: Jul. 6, 2015

(87) PCT Pub. No.: WO2014/106386
PCT Pub. Date: Jul. 10, 2014

(65) Prior Publication Data
US 2015/0348689 A1    Dec. 3, 2015

(30) Foreign Application Priority Data

Jan. 6, 2013    (CN) .......................... 2013 1 0003130

(51) Int. Cl.
*H01F 5/00*    (2006.01)
*H01F 6/04*    (2006.01)
(Continued)

(52) U.S. Cl.
CPC ........... *H01F 6/04* (2013.01); *G01R 33/3804* (2013.01); *G01R 33/3815* (2013.01); *H01F 6/06* (2013.01)

(58) Field of Classification Search
CPC ....... F17C 3/085; F17C 13/006–13/007; F17C 2227/0353; F17C 2270/0527–2270/0536
(Continued)

(56) References Cited

U.S. PATENT DOCUMENTS 4,726,199 A    2/1988    Takano et al.
4,924,198 A *    5/1990    Laskaris ............ G01R 33/3815
                                                    174/15.4
(Continued)

FOREIGN PATENT DOCUMENTS

CN    1794004 A    6/2006
CN    1885448 A    12/2006
(Continued)

*Primary Examiner* — Shawki S Ismail
*Assistant Examiner* — Lisa Homza
(74) *Attorney, Agent, or Firm* — The Webb Law Firm

(57) ABSTRACT

A superconducting magnet system for head imaging is disclosed which includes a cryocooler, a high-pressure helium container, a self-excitation heat pipe and a superconducting magnet. A second stage coldhead of the cryocooler is connected to the high-pressure helium container for converting the helium gas in the high-pressure helium container into liquid helium. The self-excitation heat pipe forms a closed cooling loop, and liquid helium in the high-pressure helium container flows circularly in the self-excitation heat pipe. The self-excitation heat pipe cools the superconducting magnet, wherein part of the liquid helium in the self-excitation heat pipe is converted into the helium gas due to the heat disturbance generated by the superconducting magnet, and the helium gas interacts with the liquid helium to generate liquid helium vibration.

6 Claims, 2 Drawing Sheets

(51) Int. Cl.
  *G01R 33/38* (2006.01)
  *G01R 33/3815* (2006.01)
  *H01F 6/06* (2006.01)

(58) Field of Classification Search
  USPC .................................................. 335/300
  See application file for complete search history.

(56) References Cited

U.S. PATENT DOCUMENTS

| | | | | |
|---|---|---|---|---|
| 5,293,749 A * | 3/1994 | Nagao | ........................ | F25B 9/14 60/520 |
| 5,613,367 A * | 3/1997 | Chen | .................. | G01R 33/3815 62/295 |
| 5,701,744 A * | 12/1997 | Eckels | .................... | F17C 13/02 324/320 |
| 5,787,714 A * | 8/1998 | Ohkura | ..................... | H01F 6/04 62/437 |
| 5,918,470 A * | 7/1999 | Xu | ........................ | F25D 19/006 335/216 |
| 5,991,647 A * | 11/1999 | Brockenborough | ...... | F25D 3/10 174/15.4 |
| 6,029,458 A * | 2/2000 | Eckels | ............... | G01R 33/3815 335/301 |
| 6,064,290 A | 5/2000 | Xu et al. | | |
| 6,140,900 A | 10/2000 | Crozier et al. | | |
| 6,289,681 B1 * | 9/2001 | Eckels | .................... | F17C 3/085 335/216 |
| 6,990,818 B2 * | 1/2006 | Hofmann | .............. | F17C 13/086 62/48.2 |
| 7,170,377 B2 * | 1/2007 | Jiang | ........................ | H01F 6/04 324/318 |
| 7,449,889 B1 * | 11/2008 | Huang | ............... | G01R 33/3802 324/309 |
| 7,498,814 B1 * | 3/2009 | Huang | ............... | G01R 33/3815 324/318 |
| 7,665,312 B2 * | 2/2010 | Jonas | .................... | F25D 19/006 324/318 |
| 8,162,037 B2 | 4/2012 | Kruip et al. | | |
| 8,238,988 B2 * | 8/2012 | Stautner | ............. | G01R 33/3804 505/162 |
| 8,291,717 B2 * | 10/2012 | Radovinsky | .......... | F25D 19/006 62/50.7 |
| 8,639,305 B2 * | 1/2014 | Harrison | ............ | G01R 33/3804 505/163 |
| 8,934,950 B2 | 1/2015 | Wang et al. | | |
| 2004/0119472 A1 * | 6/2004 | Laskaris | ............ | G01R 33/3815 324/318 |
| 2005/0062473 A1 * | 3/2005 | Ryan | .................. | G01R 33/3815 324/318 |
| 2005/0229609 A1 * | 10/2005 | Kirichek | ............... | F25B 9/02 62/6 |
| 2005/0262851 A1 * | 12/2005 | Atrey | ................. | G01R 33/3815 62/6 |
| 2006/0021355 A1 * | 2/2006 | Boesel | .................... | F25B 9/145 62/51.1 |
| 2006/0130493 A1 * | 6/2006 | Strobel | ................. | F25D 19/006 62/51.1 |
| 2006/0225437 A1 * | 10/2006 | Kazami | .................... | F25B 9/14 62/51.1 |
| 2006/0236709 A1 | 10/2006 | Steinmeyer | | |
| 2007/0001521 A1 * | 1/2007 | Kruip | ................. | G01R 33/3804 310/12.17 |
| 2007/0051115 A1 * | 3/2007 | Kraus | ................... | F25B 9/145 62/51.1 |
| 2007/0051116 A1 * | 3/2007 | Glemot | ................... | F25B 9/145 62/51.1 |
| 2007/0089432 A1 * | 4/2007 | Boesel | .................... | F25D 19/006 62/51.1 |
| 2007/0107445 A1 * | 5/2007 | Boesel | .................... | F25D 19/006 62/51.1 |
| 2007/0271933 A1 * | 11/2007 | Miki | ..................... | C01B 3/0089 62/51.1 |
| 2008/0173026 A1 * | 7/2008 | Mita | ....................... | F25B 9/145 62/6 |
| 2009/0072828 A1 * | 3/2009 | Penanen | ............ | G01R 33/0354 324/318 |
| 2009/0275476 A1 * | 11/2009 | Atrey | ....................... | F25B 9/10 505/163 |
| 2009/0293504 A1 * | 12/2009 | Oomen | .................. | F25D 19/006 62/51.1 |
| 2010/0089073 A1 * | 4/2010 | Laskaris | ................... | H01F 6/04 62/51.1 |
| 2010/0219832 A1 * | 9/2010 | Aarts | ................. | G01R 33/3815 324/318 |
| 2010/0242502 A1 * | 9/2010 | Stautner | ............. | G01R 33/3804 62/51.1 |
| 2011/0015078 A1 * | 1/2011 | Gao | .................... | G01R 33/3403 505/162 |
| 2011/0082043 A1 * | 4/2011 | Wang | ................... | G01R 33/288 505/162 |
| 2011/0100027 A1 * | 5/2011 | Schnell | ................ | G01R 33/31 62/51.1 |
| 2011/0160064 A1 * | 6/2011 | Pfleiderer | ............... | F25B 9/145 505/163 |
| 2011/0271693 A1 * | 11/2011 | Jiang | ..................... | F25D 19/006 62/47.1 |
| 2011/0284191 A1 * | 11/2011 | Jiang | .................. | G01R 33/3804 165/135 |
| 2012/0108433 A1 * | 5/2012 | Jiang | ......................... | H01F 6/04 505/163 |
| 2012/0176134 A1 * | 7/2012 | Jiang | .................. | G01R 33/3804 324/318 |
| 2012/0289406 A1 * | 11/2012 | Wang | ......................... | H01F 6/04 505/163 |
| 2012/0309630 A1 * | 12/2012 | Stautner | ............. | G01R 33/3804 505/162 |
| 2012/0313642 A1 * | 12/2012 | Zia | ..................... | G01R 33/3804 324/318 |
| 2013/0008018 A1 * | 1/2013 | Wang | ..................... | H01F 6/065 29/599 |
| 2013/0033346 A1 * | 2/2013 | Wang | ......................... | H01F 6/04 335/216 |
| 2013/0096007 A1 * | 4/2013 | Harrison | ............ | G01R 33/3804 505/162 |
| 2013/0104570 A1 * | 5/2013 | Stautner | ............. | G01R 33/3804 62/45.1 |
| 2013/0184158 A1 * | 7/2013 | Wang | ................. | G01R 33/3815 505/162 |
| 2013/0203603 A1 * | 8/2013 | Harrison | ................... | H01F 6/04 505/162 |
| 2014/0028316 A1 * | 1/2014 | Mine | .................... | G01R 33/3815 324/318 |
| 2014/0121114 A1 * | 5/2014 | Wang | .................. | G01R 33/3806 505/162 |
| 2014/0171329 A1 * | 6/2014 | Tsuda | ..................... | H01F 6/02 505/162 |
| 2015/0011395 A1 * | 1/2015 | Hu | ..................... | H01F 6/04 505/163 |
| 2015/0168079 A1 * | 6/2015 | Stautner | .................. | F28D 15/06 165/104.26 |
| 2015/0247949 A1 * | 9/2015 | Hu | ..................... | G01R 33/1261 73/382 R |
| 2015/0332829 A1 * | 11/2015 | Stautner | ................... | H01F 6/04 505/162 |
| 2015/0345837 A1 * | 12/2015 | King | ..................... | F25D 19/006 62/3.1 |
| 2016/0276082 A1 * | 9/2016 | Ackermann | ....... | G01R 33/3804 |

FOREIGN PATENT DOCUMENTS

| | | | |
|---|---|---|---|
| CN | 1959874 A | 5/2007 | |
| CN | 102136337 A | 7/2011 | |
| CN | 103077797 A | 5/2013 | |
| KR | WO 2013055079 A1 * | 4/2013 | ......... G01R 33/3804 |

* cited by examiner

SUPERCONDUCTING MAGNET SYSTEM FOR HEAD IMAGING

CROSS-REFERENCE TO RELATED APPLICATIONS

This application is the United States national phase of International Application No. PCT/CN2013/081715 filed Aug. 19, 2013, and claims priority to Chinese Patent Application No. 201310003130.6 filed Jan. 6, 2013, the disclosures of which are hereby incorporated in their entirety by reference.

TECHNICAL FIELD

The present disclosure relates to the field of nuclear magnetic resonance (NMR), and more particularly, to a superconducting magnet system for head imaging.

DESCRIPTION OF THE RELATED ART

Magnetic Resonance Imaging (MRI) is a high-tech technology for imaging according to properties of magnetic nuclei (protons) of an organism exhibited in a magnetic field. Over the past twenty years, with the development in magnet technology, superconducting technology, cryogenic technology, electronic technology, computers and other related techniques, the MRI technology has been developed rapidly. The MRI technology has become an indispensable modern diagnostic device for clinical radiological diagnosis due to its technical features and functional advantages. A MRI system mainly comprises a magnet system, a spectrometer system, a computer system and an image displaying system. Wherein, the magnet system is the most important and most costly component of the MRI system, and in the magnet system, the most important and most costly part is the main magnet. The function of the main magnet is to generate a uniform magnetic field, so that hydrogen nuclei of a human body in the magnetic field can be magnetized to form a magnetization vector. The main magnet of a MRI device is required to have a high flux density (>0.5 T) and a high uniformity (1~1.0 ppm).

As we know, the apparatuses for human body imaging comprise MRI devices for whole body imaging and devices for local body imaging. The MRI device for whole body imaging must be able to accommodate a whole human body, which requires a larger uniform region, thus the manufacture of the magnet is difficult, and the cost is high. Human head functional imaging systems have been widely used in medical diagnosis and researching. Head imaging devices require a smaller uniform region for surrounding only the head without the need of a larger magnet bore, and it is enough for an end coil that its inner diameter can make the shoulders pass through easily. However, because the head has various tissues and fine structures, the imaging requirement will be higher. The quality of MRI depends on the uniformity of the magnetic field, and the higher uniformity, the better imaging quality. Therefore, in a spherical space required for head diagnosis, there is a higher requirement for the magnetic field uniformity than that of the whole body imaging devices. A key of design of magnet for head imaging is the coil configuration of asymmetric magnets. In existing documents, a method of designing asymmetric magnet coil parameters based on minimized power consumptionis provided in U.S. Pat. No. 6,064,290 titled "SHORT BORE-LENGTH ASYMMETRIC ELECTROMAGNETS FOR MAGNETIC RESONANCE IMAGING"; and a final coil configuration that is obtained based on current density distribution and non-linear optimization provided in U.S. Pat. No. 6,140,900A1, titled "ASSYMETRIC SUPERCONDUCTING MAGNETS FOR MAGNETIC RESONANCE IMAGING".

The magnetic flux density of existing imaging systems is relatively low, generally, at a level of 1-3 T. The manufacture cost and difficulty are greatly increased for the imaging systems with flux density above 3 T. To meet the application requirements of functional imaging systems and medical research, especially for neuroscience and cognitive science, it is necessary to apply magnet systems with high magnetic flux density to the head imaging technique. High magnetic flux density may bring higher resolution and SNR (Signal to Noise Ratio), which will make the imaging clearer. Currently, the flux density of functional nuclear magnetic resonance imaging systems generated by superconducting magnet system made of NbTi material is 1.5-3 T. For a high quality of imaging system, the flux density of superconducting magnets thereof is required to increase continuously, so in order to meet the requirements of actual applications, it is necessary to obtain the superconducting magnets that are able to generate higher magnetic field with higher uniformity. Furthermore, in the existing imaging system, a large amount of liquid helium will be consumed.

SUMMARY

An object of this disclosure is to provide a superconducting magnet system for head imaging, in which helium gas in a high-pressure helium container is cooled to become liquid by a cryocooler. The cooling capacity is directly conducted to the whole superconducting magnet by a self-excitation heat pipe to make the temperature of the magnet keep uniform.

According to an aspect of the present disclosure, a superconducting magnet system for head imaging is provided, in which the superconducting magnet comprises main magnetic field superconducting coils and compensation superconducting coils, and further comprises a cryocooler, a high-pressure helium container and a self-excitation heat pipe; the second stage coldhead of the cryocooler is connected to the high-pressure helium container for cooling helium gas in the high-pressure helium container to liquid helium by using the cooling capacity of the second stage coldhead of the cryocooler; the cooling capacity is directly conducted to the superconducting magnet by the self-excitation heat pipe that wrapped around the outer surface of the superconducting magnet uniformly. Two ends of the self-excitation heat pipe are connected to the high-pressure helium container to form a closed cooling loop; and the superconducting magnet is cooled by the self-excitation heat pipe.

Preferably, a first main magnetic field superconducting coil is disposed at one end of the inner layer of the superconducting magnet, and a third main magnetic field superconducting coil is disposed at another end of the inner layer of the superconducting magnet; a fourth main magnetic field superconducting coil is disposed on the outer layer of the third main magnetic field superconducting coil; a fourth compensation superconducting coil and a third compensation superconducting coil are disposed in sequence along the axial direction towards the center of the superconducting magnet on the outer layer of the fourth main magnetic field superconducting coil; on the inner layer of the superconducting magnet, a fifth compensation superconducting coil is disposed on the inner layer of the third main magnetic field superconducting coil; on the outer layer of the first main magnetic field superconducting coil, a sixth compensation superconducting coil, a seventh compensation superconducting coil and a second main magnetic field superconducting coil are disposed in sequence from the center of the superconducting magnet to an end of the magnet, and a second compensation superconducting coil and a first compensation superconducting coil are disposed in sequence from the center of the magnet to an end of the magnet on the outer layer of the second main magnetic field superconducting coil.

Preferably, the first main magnetic field superconducting coil and the third main magnetic field superconducting coil disposed on the inner layer of the superconducting magnet are wound by $Nb_3Sn$ wires, and the second main magnetic field superconducting coil and the fourth main magnetic field superconducting coil disposed on the outer layer of the superconducting magnet are wound by NbTi wires; the ratio between radii of the third main magnetic field superconducting coil and the first main magnetic field superconducting coil is 1.3-1.35, so that a room-temperature structure that room-temperature bores of the superconducting magnet have different bore diameters in the axial direction can be obtained.

Preferably, the diameter of the self-excitation heat pipe is less than 0.5-1 mm; helium gas with 3-5 atm (atmosphere) is encapsulated in the self-excitation heat pipe.

Preferably, helium gas and liquid helium exist in the self-excitation heat pipe at the same time as a result of thermal disturbance in the superconducting magnet. Thermal induced flow is produced due to expansion of the helium gas, causing interaction between the helium gas and the liquid helium to excite vibration of the liquid helium, and thus improve heat transfer efficiency of the self-excitation heat pipe.

In this disclosure, a cryocooler, a high-pressure helium container, a self-excitation heat pipe and a superconducting magnet are provided in the superconducting magnet system for head imaging, wherein the second stage coldhead of the cryocooler is connected to the high-pressure helium container for converting the helium gas in the high-pressure helium container into liquid helium; two ends of the self-excitation heat pipe are connected respectively to the high-pressure helium container to form a closed cooling loop, so that the liquid helium in the high-pressure helium container flows circularly in the self-excitation heat pipe; the self-excitation heat pipe is wrapped uniformly around the outer surface of the superconducting magnet to cool the superconducting magnet, wherein the helium gas interacts with the liquid helium to generate liquid helium vibration when a part of the liquid helium in the self-excitation heat pipe is converted into the helium gas due to heat disturbance generated by the superconducting magnet. Thus, the effect of heat dissipation and temperature uniformity is improved and liquid helium consumption is reduced.

BRIEF DESCRIPTION OF THE DRAWINGS

The accompanying drawings are included to provide a further understanding and are incorporated in and constitute a part of this specification. It is to be understood that both the foregoing general description and the following Detailed Description are merely exemplary and are intended to provide an overview or framework for understanding the nature and character of the claims, rather than to limit the present disclosure inappropriately, in which:

DETAILED DESCRIPTION

The present disclosure will be further described in detail with reference to the drawings and embodiments.

Figure 1:
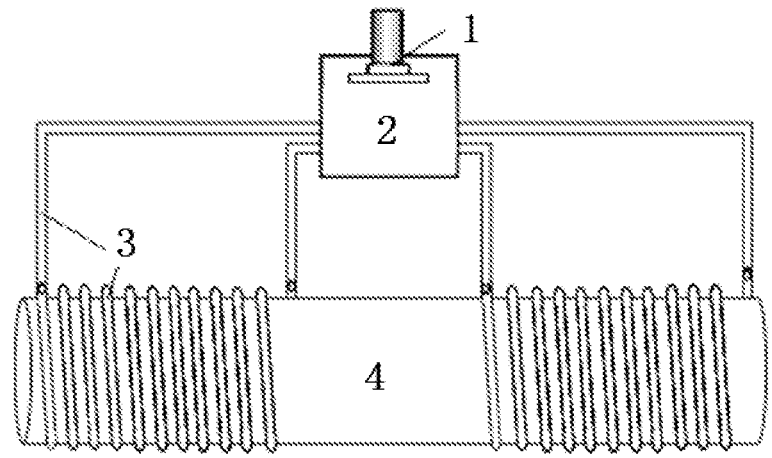
FIG. 1 is a schematic diagram of a superconducting magnet system according to one embodiment of the present disclosure.

FIG. 1 is a schematic diagram of a superconducting magnet system according to an embodiment of the present disclosure. As shown in FIG. 1, the superconducting magnet system for head imaging comprises a cryocooler 1, a high-pressure helium container 2, a self-excitation heat pipe 3 and a superconducting magnet 4. Wherein:

The second stage coldhead of the cryocooler 1 is connected to the high-pressure helium container 2 for converting the helium gas in the high-pressure helium container 2 into liquid helium; two ends of the self-excitation heat pipe 3 are connected respectively to the high-pressure helium container 2 to form a closed cooling loop, so that the liquid helium in the high-pressure helium container 2 circulates in the self-excitation heat pipe 3; the self-excitation heat pipe 3 is wrapped uniformly around the outer surface of the superconducting magnet 4 to cool the superconducting magnet 4, wherein the helium gas interacts with the liquid helium to generate liquid helium vibration when a part of the liquid helium in the self-excitation heat pipe 3 is converted into helium gas due to heat disturbance generated by the superconducting magnet 4.

In the superconducting magnet system provided in the above embodiment, helium gas in the high-pressure helium container 2 is cooled to liquid helium by using the cooling capacity provided by the cryocooler. The cooling capacity is directly conducted to the whole superconducting magnet 4 by means of the self-excitation heat pipe 3, making the temperature of the magnet uniform. Meanwhile, with the vibration of the liquid helium in the self-excitation heat pipe 3, the effect of heat dissipation is improved, and the consumption of liquid helium is reduced.

Preferably, the diameter of the self-excitation heat pipe 3 is less than 1 mm to ensure the function of self-excited heat conduction. In a preferred embodiment, the diameter of the self-excitation heat pipe 3 may be less than 0.5 mm.

Preferably, the self-excitation heat pipe 3 maybe made of a material with high strength and high thermal conductivity. Helium gas with 3-5 atm is encapsulated in the self-excitation heat pipe 3 to improve the effect of cooling and reduce the cooling weight of the system.

Figure 2:
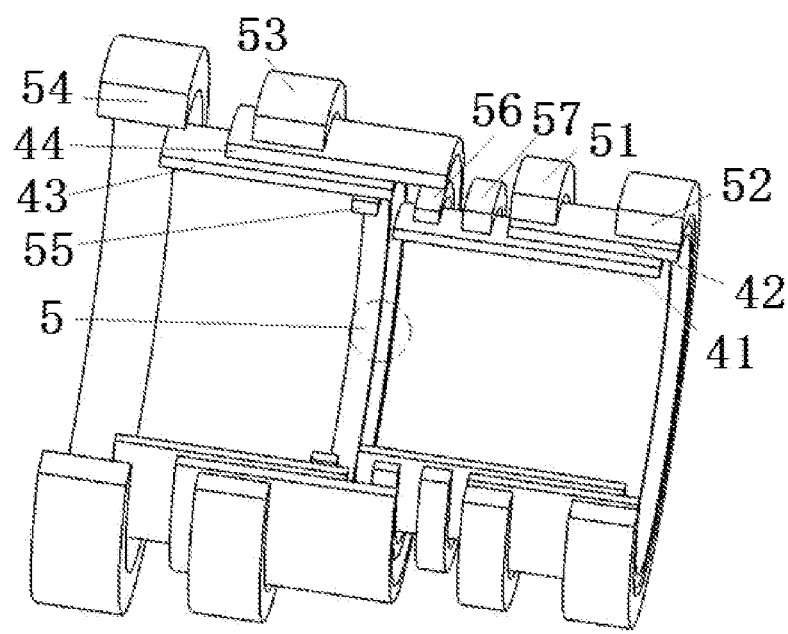
FIG. 2 is a schematic diagram of a superconducting magnet according to one embodiment of the present disclosure.

FIG. 2 is a schematic diagram of a superconducting magnet according to an embodiment of the present disclosure. As shown in FIG. 2, in the superconducting magnet 4, a first main magnetic field superconducting coil 41 is disposed at the first end of the inner side of the superconducting magnet 4, and a third main magnetic field superconducting coil 43 is disposed at the second end of the inner side of the superconducting magnet 4. A corresponding area between the first main magnetic field superconducting coil 41 and the third main magnetic field superconducting coil 43 is an imaging area 5.

On the outer layer of the first main magnetic field superconducting coil 41, in the direction from the center of the superconducting magnet 4 to the first end (i.e., in the direction from the center of the superconducting magnet 4 to the first end along the axial direction of the superconducting magnet 4), a sixth compensation superconducting coil 56, a seventh compensation superconducting coil 57 and a second main magnetic field superconducting coil 42 are arranged in sequence; on the outer layer of the second main magnetic field superconducting coil 42, in the direction from the center of the superconducting magnet 4 to the first end, a first compensation superconducting coil 51 and a second compensation superconducting coil 52 are arranged in sequence.

On the outer layer of the fourth main magnetic field superconducting coil 44, in the direction from the center of the superconducting magnet 4 to the second end (i.e., in the direction from the center of the superconducting magnet 4 to the second end along the axial direction of the superconducting magnet 4), a third compensation superconducting coil 53 and a fourth compensation superconducting coil 54 are arranged in sequence. A fifth compensation superconducting coil 55 is arranged on the inner layer of the third main magnetic field superconducting coil 43.

Wherein, the first to fourth main magnetic field superconducting coils are used for providing magnetic flux density, and the first to seventh compensation superconducting coils are used for ensuring the uniformity of the magnetic field.

Preferably, the ratio between the radii of the third main magnetic field superconducting coil 43 and the first main magnetic field superconducting coil 41 is in a range of 1.3-1.35. Thus, the structure that room-temperature bores of the superconducting magnet have different bore diameters in the axial direction can be obtained.

Because the superconducting coils used in this disclosure adopt radially graded current density, the utilization ratio of superconducting wires can be improved. A superconducting magnet for a cerebral functional imaging structure is formed by using superconducting coils with different radii and an asymmetric structure with respect to the axial line of the magnet.

Preferably, the material of the first main magnetic field superconducting coil 41 and the third main magnetic field superconducting coil 43 may be $Nb_3Sn$, and the material of the second main magnetic field superconducting coil 42 and the fourth main magnetic field superconducting coil 44 may be NbTi. Thus, main magnetic field superconducting coils with different radii have higher current carrying capability in a magnetic field above 10 T.

For example, the center magnetic field produced by the superconducting magnet 4 may be up to 9.4 T, and the spatial size of the available center imaging area 5 in the magnetic field is possible to have r=280 mm, z=160 mm.

Preferably, the material of the first to the seventh compensation superconducting coil may also be NbTi.

Figure 3:
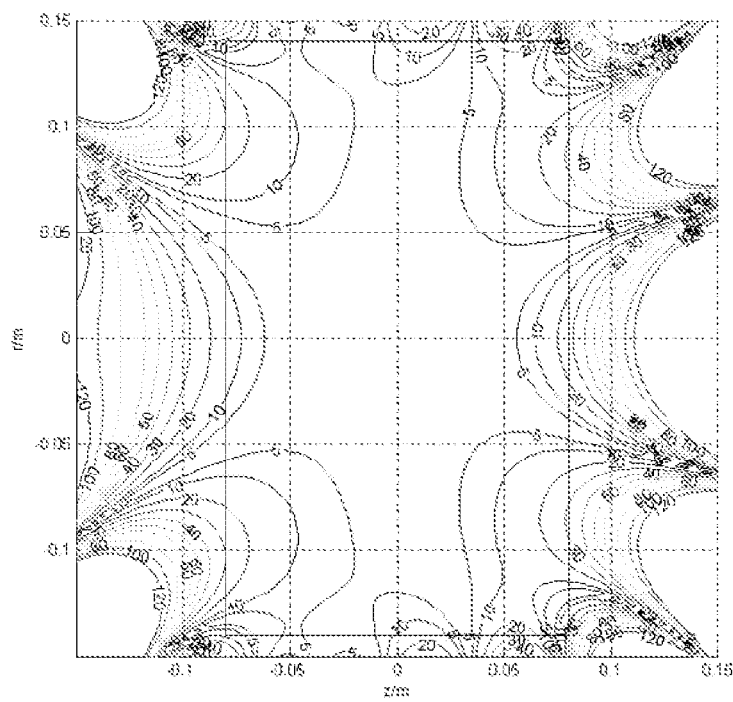
FIG. 3 is a diagram showing the distribution of magnetic field uniformity contour produced in an imaging area by the superconducting magnet.

FIG. 3 is a diagram showing the distribution of magnetic field uniformity contour produced in an imaging area by the superconducting magnet. As shown in FIG. 3, a range less than 0.05 m in the center area has a magnetic field uniformity less than 5 ppm, wherein, 1 ppm=$10^{-6}$.

Figure 4:
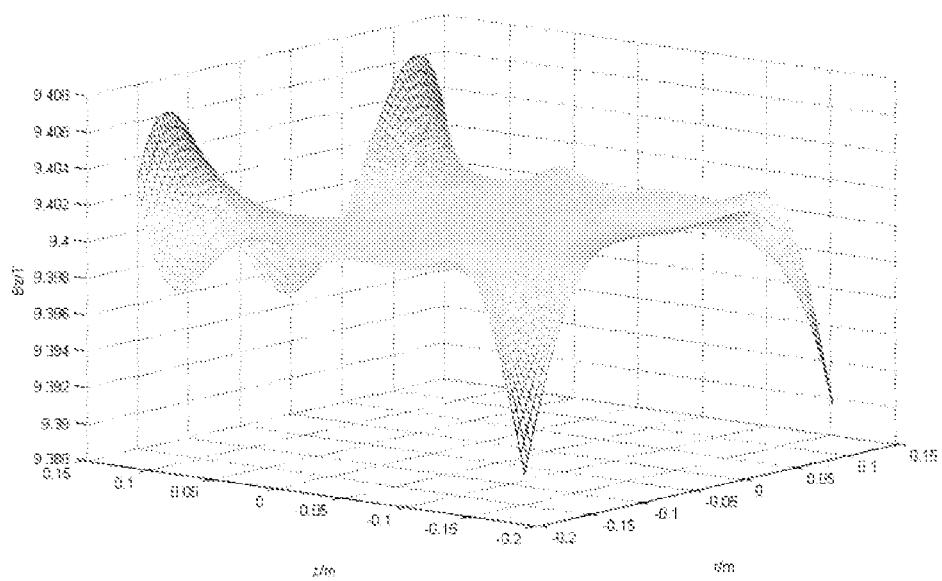
FIG. 4 is a diagram showing the spatial distribution of magnetic flux density produced in the imaging area by the superconducting magnet.

FIG. 4 is a diagram showing the spatial distribution of magnetic flux density produced in the imaging area by the superconducting magnet. As shown in FIG. 4, the center magnetic flux density is 9.4 T.

From the magnetic field uniformity distribution and magnetic flux density distribution shown in FIG. 3 and FIG. 4, it is shown that the requirement to the magnetic field for head imaging, i.e., a center magnetic field of 9.4 T can be satisfied.

In this disclosure, a superconducting magnet with a novel structure can be obtained through a magnet system with super-high magnetic field formed by multiple-coil structure made from NbTi and $Nb_3Sn$. The superconducting magnet has advantages of having a larger open, a higher magnetic flux density, and a more compact structure, which has good prospect of application.

It will be apparent to those skilled in the art that various modifications to the preferred embodiments of the disclosure as described herein can be made without departing from the spirit or scope of the disclosure as defined in the appended claims. Thus, the disclosure covers the modifications and variations, provided they come within the scope of the appended claims and the equivalents thereto.

The invention claimed is:

1. A superconducting magnet system for head imaging, comprising a cryocooler (1), a high-pressure helium container (2), a self-excitation heat pipe (3) and a superconducting magnet (4), wherein:

the second stage coldhead of the cryocooler (1) is connected to the high-pressure helium container (2) for converting the helium gas in the high-pressure helium container (2) into liquid helium;

two ends of the self-excitation heat pipe (3) are connected respectively to the high-pressure helium container (2) to form a closed cooling loop, so that the liquid helium in the high-pressure helium container (2) circulates in the self-excitation heat pipe (3);

the self-excitation heat pipe (3) is wrapped uniformly around the outer surface of the superconducting magnet (4) to cool the superconducting magnet (4);

wherein the helium gas interacts with the liquid helium to generate liquid helium vibration when a part of the liquid helium in the self-excitation heat pipe (3) is converted into helium gas due to heat disturbance generated by the superconducting magnet (4);

wherein, in the superconducting magnet (4):

a first main magnetic field superconducting coil (41) is disposed at a first end of the inner side of the superconducting magnet (4), a third main magnetic field superconducting coil (43) is disposed at a second end of the inner side of the superconducting magnet (4), and a corresponding area between the first main magnetic field superconducting coil (41) and the third main magnetic field superconducting coil (43) is an imaging area (5);

on the outer layer of the first main magnetic field superconducting coil (41), in the direction from the center of the superconducting magnet (4) to the first end, a sixth compensation superconducting coil (56), a seventh compensation superconducting coil (57) and a second main magnetic field superconducting coil (42) are arranged in sequence; on the outer layer of the second main magnetic field superconducting coil (42), in the direction from the center of the superconducting magnet (4) to the first end, a first compensation superconducting coil (51) and a second compensation superconducting coil (52) are arranged in sequence;

on the outer layer of a fourth main magnetic field superconducting coil (44), in the direction from the center of the superconducting magnet (4) to the second end, a third compensation superconducting coil (53) and a fourth compensation superconducting coil (54) are arranged in sequence, and a fifth compensation superconducting coil (55) is arranged on the inner layer of the third main magnetic field superconducting coil (43).

2. The superconducting magnet system according to claim 1, wherein: the diameter of the self-excitation heat pipe (3) is less than 1 mm.

3. The superconducting magnet system according to claim 1, wherein: helium gas with 3-5 atm is encapsulated in the self-excitation heat pipe (3).

4. The superconducting magnet system according to claim 1, wherein:
the ratio between the radii of the third main magnetic field superconducting coil (43) and the first main magnetic field superconducting coil (41) is in a range of 1.3-1.35.

5. The superconducting magnet system according to claim 1, wherein:
the material of the first main magnetic field superconducting coil (41) and the third main magnetic field superconducting coil (43) is Nb3Sn, and the material of the second main magnetic field superconducting coil (42) and the fourth main magnetic field superconducting coil (44) is NbTi.

6. The superconducting magnet system according to claim 1, wherein:
the material of the first compensation superconducting coil (51) to the seventh compensation superconducting coil (57) is NbTi.

\* \* \* \* \*